(12) United States Patent
Ishimine et al.

(10) Patent No.: US 10,566,264 B2
(45) Date of Patent: Feb. 18, 2020

(54) FLOW PATH MEMBER AND SEMICONDUCTOR MODULE

(71) Applicants: KYOCERA CORPORATION, Kyoto-shi, Kyoto (JP); TOSHIBA MATERIALS CO., LTD., Yokohama-shi, Kanagawa (JP)

(72) Inventors: Yuusaku Ishimine, Satsumasendai (JP); Takeshi Muneishi, Kyoto (JP); Kazuhiko Fujio, Satsumasendai (JP); Yoshiyuki Fukuda, Ayase (JP); Kentaro Takanami, Yokohama (JP); Takao Shirai, Yokohama (JP)

(73) Assignees: KYOCERA CORPORATION, Kyoto-shi, Kyoto (JP); TOSHIBA MATERIALS CO., LTD., Yokohama-shi, Kanagawa (JP)

( * ) Notice: Subject to any disclaimer, the term of this patent is extended or adjusted under 35 U.S.C. 154(b) by 2 days.

(21) Appl. No.: 16/062,112

(22) PCT Filed: Dec. 16, 2016

(86) PCT No.: PCT/JP2016/087641
§ 371 (c)(1),
(2) Date: Jun. 14, 2018

(87) PCT Pub. No.: WO2017/104830
PCT Pub. Date: Jun. 22, 2017

(65) Prior Publication Data
US 2018/0374778 A1     Dec. 27, 2018

(30) Foreign Application Priority Data

Dec. 18, 2015  (JP) .................................. 2015-248039

(51) Int. Cl.
| | | |
|---|---|---|
| *H01L 23/00* | (2006.01) | |
| *H01L 23/473* | (2006.01) | |
| *C04B 35/587* | (2006.01) | |
| *F28F 13/02* | (2006.01) | |

(Continued)

(52) U.S. Cl.
CPC .......... *H01L 23/473* (2013.01); *C04B 35/587* (2013.01); *F28F 13/02* (2013.01); *H01L 23/36* (2013.01); *H05K 7/20* (2013.01)

(58) Field of Classification Search
CPC combination set(s) only.
See application file for complete search history.

(56) References Cited

U.S. PATENT DOCUMENTS

2015/0122464 A1* 5/2015 Ito ........................... F28F 21/04
165/104.28

FOREIGN PATENT DOCUMENTS

| JP | 2002329938 A | 11/2002 |
|---|---|---|
| JP | 2013012591 A | 1/2013 |

(Continued)

*Primary Examiner* — Fernando L Toledo
*Assistant Examiner* — Valerie N Newton
(74) *Attorney, Agent, or Firm* — Viering Jentschura & Partner MBB

(57) ABSTRACT

A flow path member may include silicon nitride ceramics. The flow path member may have an inlet port, an outlet port, and a flow path connected to the inlet port and the outlet port inside the flow path member. A plurality of needle-shaped crystals may be arranged on a surface of the flow path where the needle-shaped crystals intersect each other.

8 Claims, 4 Drawing Sheets

(51) Int. Cl.
*H01L 23/36* (2006.01)
*H05K 7/20* (2006.01)

(56) References Cited

FOREIGN PATENT DOCUMENTS

| | | |
|---|---|---|
| JP | 2013207200 A | 10/2013 |
| WO | 2015147071 A1 | 10/2015 |

* cited by examiner

FLOW PATH MEMBER AND SEMICONDUCTOR MODULE

CROSS-REFERENCE TO RELATED APPLICATIONS

This application is a national stage application claiming priority to International Application No. PCT/JP2016/087641 filed on Dec. 16, 2016, which claims priority to Japanese Patent Application No. 2015-248039 filed on Dec. 18, 2015; all of which are herein incorporated by reference in their entirety and for all purposes.

TECHNICAL FIELD

The present disclosure relates to a flow path member and a semiconductor module.

BACKGROUND ART

In recent years, semiconductor devices have been used for the purpose of performing high-speed switching at large currents. There are possibilities that the semiconductor devices affect the switching function if heat generation occurs and the temperature becomes high. Therefore, flow path members which have flow paths capable of cooling the semiconductor devices through heat exchange with fluid have been used for mounting the semiconductor devices.

As an example of such flow path members, for example, in Japanese Unexamined Patent Publication JP-A 2002-329938, there is provided a flow path member having a structure in which an air gap which serves as a coolant flow path is formed below a circuit having a semiconductor part mounted thereon, the distance from the circuit to the air gap in a substrate thickness direction satisfies a condition of 0.5 mm≤t≤5 mm, and the distance t and the width Y of the air gap are in the relationship of Y≤20t.

SUMMARY

A flow path member according to the present disclosure comprises silicon nitride ceramics, the flow path member being provided with an inlet port, an outlet port, and a flow path connected to the inlet port and the outlet port inside the flow path member. In addition, a plurality of needle-shaped crystals which exist on a surface of the flow path, intersect each other.

DETAILED DESCRIPTION

Recently, since the amounts of heat generated during use of semiconductor devices increase, a further improvement in heat generation efficiency has been required for flow path members.

A flow path member according to the present disclosure has excellent heat exchange efficiency. Hereinafter, the flow path member and a semiconductor module according to the present disclosure will be described with reference to drawings.

Figure 1:
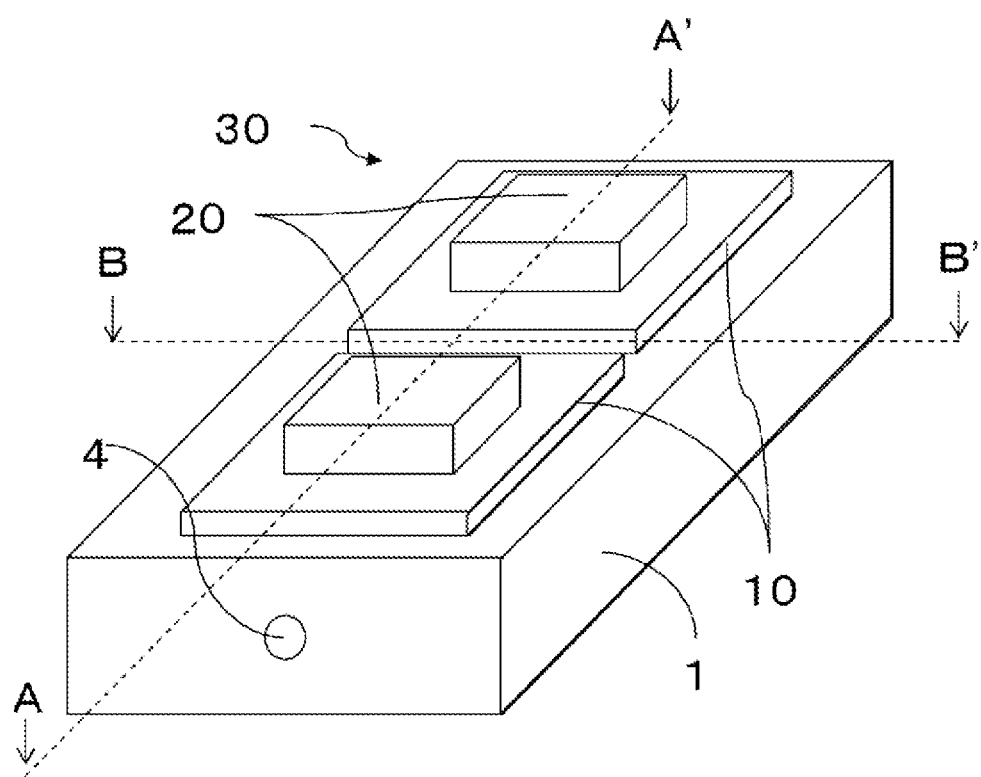
FIG. 1 is a perspective view illustrating an example of a semiconductor module according to the present disclosure.

As illustrated in FIG. 1, a semiconductor module 30 according to the present disclosure includes a flow path member 1, a metal layer 10 on the flow path member 1, and a semiconductor device 20 placed on the metal layer 10. The semiconductor device 20 generates heat during use, and the amount of heat generated is particularly large in a case of a power semiconductor such as an insulated gate bipolar transistor (IGBT) device or a light emitting diode (LED) element.

Figure 2:
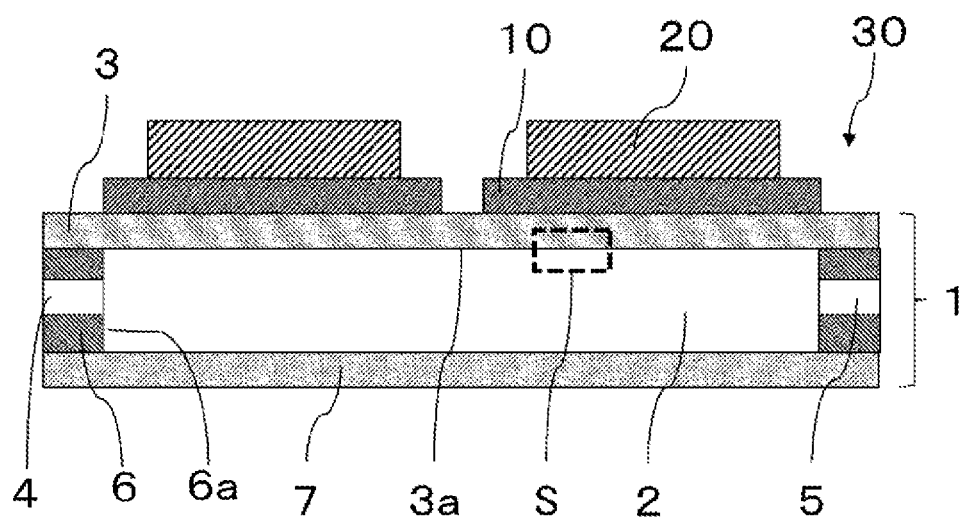
FIG. 2 is a sectional view taken along the line A-A' in FIG. 1.

Note that although FIGS. 1 and 2 illustrate an example in which two semiconductor devices 20 are disposed on the flow path member 1 via the metal layers 10, the number of the semiconductor devices 20 is not limited to two, and may be one or equal to or greater than three.

Figure 3:
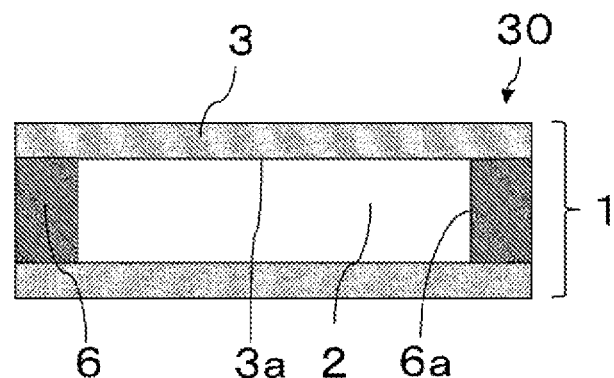
FIG. 3 is a sectional view taken along the line B-B' in FIG. 1.

In addition, the flow path member 1 according to the present disclosure includes a cover portion 3, a side wall portion 6, and a bottom plate portion 7, for example, as illustrated in FIGS. 2 and 3. Also, the flow path member 1 includes an inlet port 4 and an outlet port 5. In addition, a space which is surrounded by the cover portion 3, the side wall portion 6, and the bottom plate portion 7 and extends from the inlet port 4 to the outlet port 5 serves as a flow path 2 through which a fluid flows. Here, the cover portion 3 is a member on which an object to be treated, such as the semiconductor device 2, is placed via the metal layer 10. In addition, the side wall portion 6 is a member connected to the cover portion 3. In addition, the bottom plate portion 7 is a member which faces the cover portion 3 and is connected to the side wall portion 6. Note that although FIG. 2 illustrates an example in which the inlet port 4 and the outlet port 5 are formed in the side wall portion 6, an appropriate change may be made, and for example, the inlet port 4 and the outlet port 5 may be provided in the cover portion 3 or the bottom plate portion 7.

In addition, the cover portion 3, the side wall portion 6, and the bottom plate portion 7 are formed of silicon nitride ceramics in the flow path member 1 according to the present disclosure. When the cover portion 3, the side wall portion 6, and the bottom plate portion 7 are made of silicon nitride ceramics as described above, it is possible to use the flow path member in an environment in which a corrosive coolant is caused to flow through the flow path 2 or a corrosive environment. Note that the silicon nitrogen ceramics is a material in which the content of silicon nitride is equal to or greater than 70% with respect to 100% by mass of all constituents constituting the ceramics.

Note that whether or not a material is silicon nitride ceramics may be checked by the following method. First, measurement using an X-ray diffraction apparatus (XRD) is performed, the Joint Committee on Powder Diffraction Standards (JCPDS) card is referred to identify the material, thereby checking presence of silicon nitride. Next, an ICP emission spectrometer (ICP) or a fluorescent X-ray spectrometer (XRF) is used to obtain the content of silicon (Si), and the content of silicon nitride is obtained through conversion into silicon nitride ($Si_3N_4$). Then, if the content of silicon nitride is equal to or greater than 70% with respect to 100% by mass of all constituents constituting the ceramics, the material is regarded as silicon nitride ceramics.

In addition, a plurality of needle-shaped crystals which exist on the surface of the flow path 2 in the flow path member 1 according to the present disclosure, intersect each other. The flow path member 1 having the configuration of the present disclosure can suppress an excessive increase in temperature at the semiconductor device 20 due to heat exchange between heat generated from the semiconductor device 20 during use and heat in the coolant flowing through the flow path 2. In addition, since the plurality of needle-shaped crystals which exist on the surface of the flow path 2, intersect each other, the flow path member 1 according to the present disclosure has excellent heat exchange efficiency.

The surface of the flow path 2 in the flow path member 1 according to the present disclosure will be described with reference to FIGS. 4 and 5.

Figure 4:
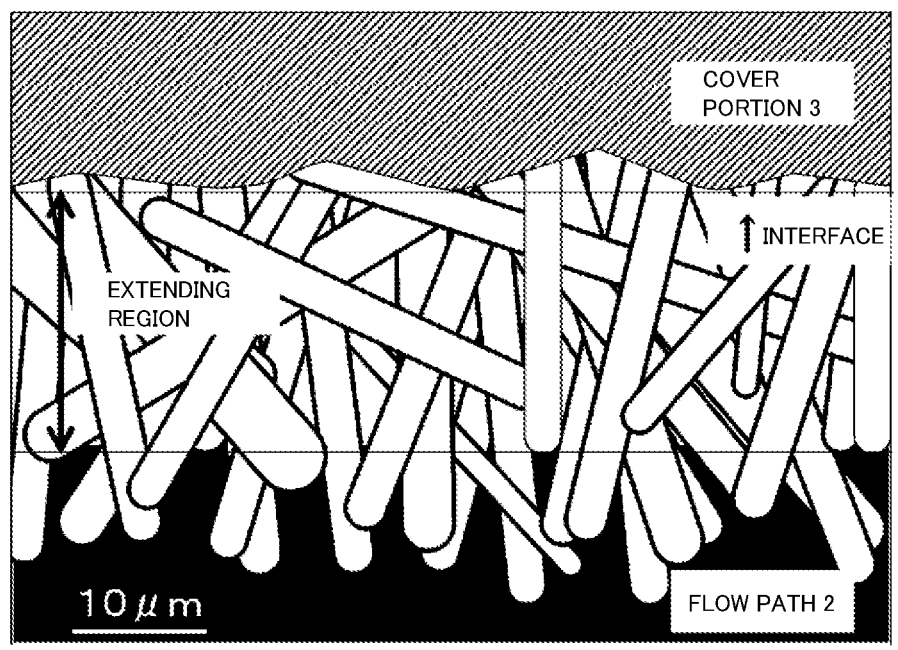
FIG. 4 is a schematic view illustrating the part S in FIG. 2 in an enlarged manner.
Figure 5:
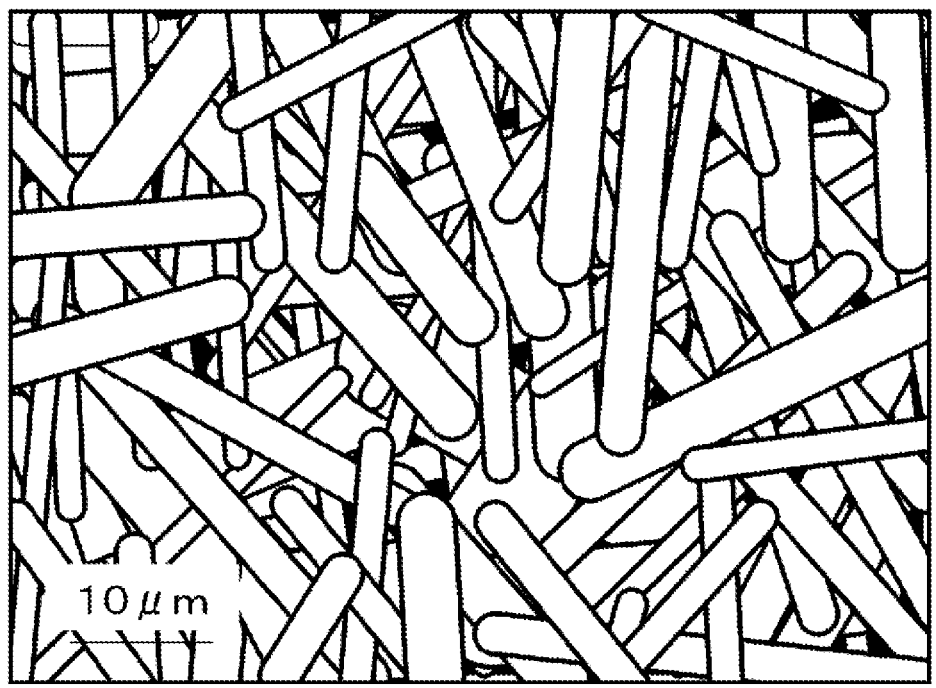
FIG. 5 is a schematic view illustrating a surface of a flow path as viewed from the front.

As illustrated in FIGS. 4 and 5, the plurality of needle-shaped crystals which exist on the surface of the flow path 2 in the flow path member 1 according to the present disclosure, intersect each other. Note that the needle-shaped crystals mean crystals having an aspect ratio, which is a ratio between a longer diameter and a shorter diameter of one crystal, which are equal to or greater than 2. In addition, the term "intersect each other" indicates a state where a longer diameter of a certain crystal intersects longer diameters of a plurality of crystals as illustrated in FIGS. 4 and 5, for example.

In addition, since the plurality of needle-shaped crystals which exist on the surface of the flow path 2 in the flow path member 1 according to the present disclosure, intersect each other, when the coolant flowing through the flow path 2 is brought into contact with the surface of the flow path 2, a flow of a coolant is disturbed by the intersecting needle-shaped crystals. Then, since transfer efficiency of the heat generated from the semiconductor device 20 is improved by this turbulence, the flow path member 1 according to the present disclosure has excellent heat exchange efficiency.

In addition, the needle-shaped crystals may comprise an extending region and the height of the extending region may be equal to or greater than 10 μm. Note that as illustrated in FIG. 4, the extending region is a region up to a portion in which overlapping of the needle-shaped crystals cannot be observed and the block color of the background is observed when a virtual boundary is moved from a boundary between a portion from which the needle-shaped crystals do not extend and a portion from which the needle-shaped crystals extend, toward the side of the flow path 2. When such a configuration is satisfied, the flow path member 1 according to the present disclosure has further excellent heat exchange efficiency.

Here, as a method of observing the needle-shaped crystals extending at the surface of the flow path 2, a sample having an appropriate size is cut from the cover portion 3, and the observation may then be performed so that the region from which the needle-shaped crystals extend is included by using a scanning electron microscope (SEM) at 1000 to 3000-fold magnification.

In addition, ten or more long needle-shaped crystals having an aspect ratio of equal to or greater than 6 may be present within an area of 2600 μm² on the surface of the flow path 2. Note that a photograph of the surface of the flow path 2 as viewed from the front, as illustrated in the schematic view of FIG. 5, is used for measuring the aspect ratio. Then, if a ruler is placed along an outline of a needle-shaped crystal as a target of measurement, and an outline still exists even beyond another needle-shaped crystal overlapping therewith in a case where the plurality of needle-shaped crystals overlap one another, and in particular, for measuring long diameters, then the outline beyond the needle-shaped crystal is regarded as a part of the outline of the needle-shaped crystal as a target of the measurement and is measured. In addition, the length of a line which perpendicularly intersects the center of a long diameter is regarded as a short diameter. Since it is possible to disturb the coolant in contact with the surface of the flow path 2 when such a configuration is satisfied, the flow path member 1 may have further excellent heat exchange efficiency.

In addition, the number of the long needle-shaped crystals having an aspect ratio of equal to or greater than 6 may increase from the inlet port 4 or the outlet port 5 toward the center of the flow path 2 on the surface of the flow path 2. When such a configuration is satisfied, it is possible to further disturb the coolant, which has been warmed by the heat exchange with the semiconductor device 20 on the side of the inlet port 4, at the center of the flow path 2 and to thereby enhance the heat exchange efficiency with the semiconductor device 20 on the side of the outlet port 5.

In addition, the height of the extending region of the needle-shaped crystals on a surface 3a of the flow path 2 at the cover portion 3 may be higher than the height of the extending region of the needle-shaped crystals on a surface 6a of the flow path 2 at the side wall portion 6. When such a configuration is satisfied, the coolant is disturbed particularly on the surface of the 3a of the flow path 2 at the cover portion 3 in the surface of the flow path 2, and the flow path member 1 thus has further excellent heat exchange efficiency. In addition, the height of the extending region of the needle-shaped crystals on the surface 3a of the flow path 2 at the cover portion 3 may be higher than the height of the extending region of the needle-shaped crystals on the surface 6a of the flow path 2 at the side wall portion 6 by 1 μm or greater.

In addition, the heat conductivity of the silicon nitride ceramics constituting the cover portion 3, the side wall portion 6, and the bottom plate portion 7 may be equal to or greater than 50 W/(m·K). When such a configuration is satisfied, since the heat conductivity of the silicon nitride ceramics is high, it is possible to more effectively transfer heat to the side of the flow path 2.

In addition, the strength ratio $I_s/I_m$ on the surface 3a of the flow path 2 at the cover portion 3 may be smaller than the strength ratio $I_s/I_m$ on the surface 6a of the flow path 2 at the side wall portion 6, in which $I_m$ denotes the peak strength which exists at a diffraction angle of 27.1±0.2° measured by the XRD using a Kα ray of Cu, and $I_s$ denotes the peak strength which exists at a diffraction angle of 29.7±0.2°. In addition, the strength ratio $I_s/I_m$ on the surface 3a of the flow path 2 at the cover portion 3 may be less than the strength ratio $I_s/I_m$ on the surface 6a of the flow path 2 at the side wall portion 6 by 0.01 or less.

Here, $I_m$ is derived from silicon nitride, and $I_s$ is derived from a rare earth element-hafnium-oxygen compound (for example, $Y_2Hf_2O_7$, $Er_2Hf_2O_7$, or the like). In addition, the smaller strength ratio $I_s/I_m$ means the smaller existence amount of rare earth element-hafnium-oxygen compound. In addition, sine the heat conductivity of the rare earth element-hafnium-oxygen compound is greater than that of silicon nitride, the heat conductivity becomes higher as the existence amount of rare earth element-hafnium-oxygen compound is smaller. Therefore, when such a configuration is satisfied, since the heat conductivity of the cover portion 3 is higher than the heat conductivity of the side wall portion 6, it is possible to more efficiently transfer the heat generated from the semiconductor device 20 via the cover portion 3. Therefore, with the aforementioned configuration, the flow path member 1 may have further excellent heat change efficiency.

Note that the measurement using the XRD can be performed as follows. First, the surface 3a of the flow path 2 at the cover portion 3 and the surface 6a of the flow path 2 at the side wall portion 6 are set as measurement surfaces. Then, a Cu target (Cu—Kα) is used, and the measurement may be performed under conditions of a tube voltage of 45 kV, a tube current of 110 mA, a detector distance of 17 cm, a collimator diameter of 0.1 mmφ, a measurement time of 60 sec/frame, and a scanning range (2θ) of 10° to 50°. In addition, each compound may be identified with reference to the JCPDS card, and for example, No. 00-033-1160 may be referred for $Si_3N_4$, No. 00-024-1406 may be referred for $Y_2Hf_2O_7$, and No. 00-024-0401 may be referred for $Er_2Hf_2O_7$.

In addition, the semiconductor module 30 may include the semiconductor device 20 on the flow path member 1 via the metal layer 10, and since the flow path member 1 may have excellent heat exchange efficiency, it is possible to maintain a high function of switching at a high speed with a large current.

Here, examples of the metal layer 10 includes one containing copper, silver, aluminum, or the like, for example as a main constituent. When the metal layer 10 contains such a main constituent, the electric resistance of the metal layer 10 is low, and therefore it is possible to increase an allowable current. In addition, when the metal layer 10 contains such a main constituent, the heat conductivity of the metal layer 10 is high, and therefore heat dissipation increases.

Although the example in which the heat source is the semiconductor device 20 has been illustrated in the above description, the heat source is not limited to the semiconductor device 20 and may be a sublimation type thermal printer head device, a thermal ink-jet printer head device, or the like. Note that, although not shown, the metal layer 10 and the semiconductor device 20 may be configured to be connected to another circuit substrate or an external power source by using a bonding wire or the like.

In addition, the flow path member 1 may include therein an insulating wall portion for changing or branching a direction in which the fluid flows. When such an insulating wall portion is provided, it is possible to efficiently cool the semiconductor device 20.

Next, an example of a method of producing the flow path member 1 will be described.

Note that in the following description, an example in which the flow path member 1 is may be produced by a laminating method using a ceramic green sheet will be described as the method of producing the flow path member 1.

First, desired amounts of silicon nitride powder and sintering aid powder are weighed. Then, the powder is placed in a rotation mill with a ball formed of ceramics therein to mix and pulverize the powder, and an organic binder such as paraffin wax, polyvinyl alcohol (PVA), polyethylene glycol (PEG), or the like is added thereto and mixed therewith, thereby producing a slurry. Note that a ball formed of silicon nitride ceramics, for example, is used as the ball which is used for the mixing and the pulverizing and is formed of ceramics.

Note that α-type silicon nitride powder having a small aspect ratio and β-type silicon nitride powder having a large aspect ratio are used as the silicon nitride powder (grain orientation). Here, the β-type silicon nitride powder serves as seeds of the needle-shaped crystals. In addition, it is possible to cause the β-type silicon nitride crystals crystallized from the β-type silicon nitride powder having the large aspect ratio to grow by precipitation after dissolution of the α-type silicon nitride powder and phase transition to the β type by using powder having different particle configurations to cause sintering. In addition, since the β-type silicon nitride powder does not have directionality due to grain orientation, it is possible to cause the plurality of needle-shaped crystals which exist on the surface of the flow path 2 to intersect each other.

In addition, in order to set the height of the extending region of the needle-shaped crystals on the surface of the flow path 2 to be equal to or greater than 10 μm, that is, in order to increase the needle-shaped crystals, it is only necessary to use the β-type silicon nitride powder in which the longer diameters of the powder are equal to or greater than 5 μm, for example, or to elongate the sintering time. Note that the average grain diameter of the α-type silicon nitride powder is equal to or less than 2 μm, for example, and the longer diameter of the β-type silicon nitride powder is equal to or greater than 8 μm, for example.

In addition, a difference between an upper limit value and a lower limit value of grain size distribution of the silicon nitride powder is equal to or greater than 10 μm, for example. In addition, the lower limit value of the grain size distribution is equal to or less than 0.2 μm, for example, while the upper limit value is equal to or greater than 10 μm, for example.

In addition, as for the blending ratio between the α-type silicon nitride powder and the β-type silicon nitride powder, a mountain (peak) of smaller grain diameters is set to be greater than a mountain (peak) of larger grain diameters in the grain size distribution. In this manner, it is possible to improve sintering properties and to cause the needle-shaped crystals to grow by increasing the amount of small particles, that is, the α-type silicon nitride powder.

In addition, when the content of oxygen in the silicon nitride powder is equal to or less than 1.7% by mass, it is possible to obtain silicon nitride ceramics having high heat conductivity.

In addition, a rare earth compound such as yttrium oxide may be used as the sintering aid. In this case, the amount of the rare earth compound added is equal to or greater than 0.1% by mass and equal to or less than 17.5% by mass in terms of an oxide of a rare earth element with respect to the total amount 100% by mass of the silicon nitride powder and the sintering aid, for example. The rare earth compound has an effect of improving sintering properties.

In addition, at least one kind selected from a group consisting of Mg, Ca, Hf, Ti, Zr, V, Nb, Ta, Cr, Mo, and W may be added as the sintering aid within a range of equal to or greater than 0.1% by mass and equal to or less than 5% by mass with respect to the total amount 100% by mass of the silicon nitride powder and the sintering aid in terms of the oxide. These constituents added have an effect of lowering the phase transition temperature from the α type to the β type. It is possible to promote the grain growth of the needle-shaped crystals by lowering the phase transition temperature. In addition, there is also an effect of reinforcing the grain boundary phase. Therefore, effects of improving heat conductivity and strength are also obtained.

In addition, $HfO_2$ may be added as the sintering aid concurrently with the rare earth compound. Since the speed of spreading an element having a large atom radius, such as a rare element, to the grain boundary is low, a non-uniform grain boundary phase tends to be formed. Meanwhile, it is possible to promote the spreading of the rare earth compound to the grain boundary when $HfO_2$ is added. In addition, it is possible to promote densification of the needle-shaped crystals of silicon nitride by promoting the spreading. Further, since variations in configurations of the grain boundary phase decreases, variations in a variety of properties that the silicon nitride ceramics decreases.

In addition, in order to cause 10 or more long needle-shaped crystals having an aspect ratio of equal to or 6 to exist within an area of 2600 µm² on the surface of the flow path 2, for example, it is only necessary to place a large amount of metal earth oxide, to add Mg or the like to lower a liquid phase melting point, to lower the phase transition temperature from the α type to the β type, and to set the sintering type within the phase transition temperature range to be sufficiently long.

Next, a sheet is produced by using the obtained slurry by the doctor blade method. Then, a ceramic green sheet having a predetermined shape is obtained by punching the obtained sheet with a die or performing laser working thereon.

In addition, the ceramic green sheet having the predetermined shape may be obtained by punching a sheet, which is produced by the roll compaction method in which granules granulated by spray-drying the obtained slurry are rolled, with a die or performing laser working thereon, as another method of producing the molded article. Further, the sheet may be cut and worked into the predetermined shape after the obtained granules are molded by a cold isostatic press molding (CIP) method, an extrusion molding method, a pressing method, or the like, as a method of obtaining the ceramic green sheet other than the aforementioned method.

The slurry is applied to at least one of surfaces at the portions which serves as bonding surfaces of the plurality of obtained ceramic green sheets, and the ceramic green sheets are then laminated and pressurized, thereby obtaining a molded body. Note that according to the aforementioned lamination method, it is possible to easily change the thicknesses of the cover portion 3, the side wall portion 6, and the bottom plate portion 7 by changing the number of ceramic green sheets laminated. In addition, it is possible to produce the flow path member 1 provided with the complicated flow path 2 including the insulating wall portion by laminating the ceramic green sheets formed into the desired shape by being punched with the die or being subjected to the laser working.

Here, if the ceramic green sheets which serve as the cover portion 3 are formed by using the β-type silicon nitride powder having the larger long diameters than those of the β-type silicon nitride powder used in the ceramic green sheets that serve as the side wall portion 6, it is possible to set the height of the extending region of the needle-shaped crystals at the surface 3a of the flow path 2 at the cover portion 3 to be higher than the height of the extending region of the needle-shaped crystals on the surface 6a of the flow path 2 at the side wall portion 6.

In addition, if the ceramic green sheets which serve as the cover portion 3 are formed by using raw materials adjusted such that the total amount of the rare earth compound and $HfO_2$ added is smaller than that in the ceramic green sheets which serve as the side wall portion 6, it is possible to set the strength ratio $I_s/I_m$ on the surface 3a of the flow path 2 at the cover portion 3 to be smaller than the strength ratio $I_s/I_m$ on the surface 6a of the flow path 2 at the side wall portion 6.

In addition, in order to increase the number of long needle-shaped crystals having an aspect ratio of equal to or greater than 6 from the inlet port 4 or the outlet port 5 toward the center of the flow path 2 on the surface of the flow path 2, for example, it is only necessary to apply a slurry containing a sintering aid (Mg or the like) for lowering the liquid phase melting point to the center, and to promote grain growth of the silicon nitride crystals at the center.

Note that although pore working may be performed after the laminated molded body is obtained when the inlet port 4 and the outlet port 5 are provided at the side wall portion 6 as illustrated in FIGS. 1 and 2, the working chips may remain therein, and therefore, working to create pores may be performed in a stage in which the ceramic green sheets are formed.

Next, the obtained molded body is degreased by applying heat at a temperature of 400 to 800° C. in the atmospheric air or in the non-oxidizing atmosphere for 1 to 3 hours.

Next, the temperature is raised to 1400-1600° C. for 2 hours or longer in nitrogen gas at an ordinary pressure. It is possible to uniformly perform phase transition from the α type to the β type and to effectively increase the aspect ratio of the final silicon nitride crystals by taking a long time to raise the temperature. Thereafter, firing is performed in inert gas such as nitrogen gas at 1600° C. or higher for 6 hours or longer. The sintering process is performed by sintering at an ordinary pressure or atmospheric pressurized sintering, for example. In addition, in order to further promote the grain growth of the silicon nitride crystals, for example, it is only necessary to set the sintering temperature at 1800° C. or higher or to set the sintering time to 10 hours or longer.

In addition, in a case where the cover portion 3 is independently produced and thereafter is bonded to the side wall portion 6 or the bottom plate portion 7, working to remove a grain boundary phase on the surface which serves as the flow path 2 at the cover portion 3, the side wall portion 6, and the bottom plate portion 7 may be performed as needed to adjust the height of the extending region of the needle-shaped crystals on the surface of the flow path 2.

It is possible to obtain the flow path member 1 by the aforementioned manufacturing method. Note that polishing working may be performed on the flow path member 1 in accordance with the purpose of use.

Next, the semiconductor module 30 can be produced by providing the metal layer 10 at the cover portion 3 of the flow path member 1 and mounting the semiconductor device 20 on the metal layer 10.

Note that conductive powder of silver, copper, aluminum, or the like, glass powder, and organic vehicle, for example, may be used to produce a paste, and the paste may be printed at a desired position by a known screening printing method, dried, and then fired in an atmosphere in accordance with the conductive powder to obtain the metal layer 10 provided on the cover portion 3. Alternatively, the metal layer 10 may be produced by an electrolytic plating method, an electroless plating method, or a direct bonding method of an active metal method using a copper plate or an aluminum plate as another producing method.

Although the present disclosure has been described above in detail, the present disclosure is not limited to the aforementioned embodiment, and various modifications, improvement, and the like are possible without departing from the scope of the present disclosure.

Although non-limiting examples of the present disclosure will be specifically described below, the present disclosure is not limited to these examples.

EXAMPLE 1

Samples having different surface configurations of flow paths were produced, and heat exchange efficiency was compared. Note that the shape of the samples was as that of the flow path member having the configuration illustrated in FIG. 1.

First, silicon nitride powder illustrated in Table 1 was prepared. Note that the respective samples in which the content of oxygen in the silicon nitride powder was equal to or less than 1.2% by mass were used. In addition, a ratio between the height of a mountain peak of smaller grain diameters and the height of a mountain peak of larger grain diameters in Sample No. 3 was set to 1.2:1.

illustrated in the schematic view of FIG. 4 was checked by using a SEM at 2000-fold magnification, and presence of needle-shaped crystals having aspect ratio on the surface of the flow path of equal to or greater than 2 and presence of intersection based on whether or not a longer diameter of a certain crystal intersected longer diameters of a plurality of crystals were checked. The results are shown in Table 1.

TABLE 1

| | Silicon nitride powder | | | | Presence of | | |
|---|---|---|---|---|---|---|---|
| Sample No. | α type | Grain diameter (μm) | β type | Longer diameter (μm) | needle-shaped crystals | Presence of interlacing | Heat exchange efficiency |
| 1 | ○ | 1.5 | — | — | Not present | — | 3 |
| 2 | ○ | 1.5 | — | — | Present | Not present | 2 |
| 3 | ○ | 1.5 | ○ | 4.0 | Present | Present | 1 |

Then, yttrium oxide powder was used as a sintering aid and was weighed so that the amount was 7.0% by mass with respect to the total amount 100% by mass of the silicon nitride powder and the sintering aid. Then, the powder was placed in a rotation mill with a ball formed of silicon nitride ceramics therein to mix and pulverize the powder, and an organic binder was added thereto and mixed therewith, thereby producing a slurry.

Next, granules granulated by spray-drying the obtained slurry was used to produce a sheet by a roll compaction method in which the granules were rolled. Thereafter, the sheet was punched by a die, thereby obtaining a ceramic green sheet having a predetermined shape.

Next, the slurry was applied to at least one of surfaces at parts which served as bonding surfaces of the plurality of obtained ceramic green sheets, and the ceramic green sheets were laminated and pressurized, thereby obtaining a molded body having the shape of the flow path member illustrated in FIG. 1. Note that Sample No. 1 was obtained as a molded body in which the cover portion, the side wall portion, and the bottom plate portion were independent from each other.

Next, the obtained molded body was degreased by applying heat at a temperature of 600° C. in a non-oxidizing atmosphere for 2 hours, subsequently, the temperature was raised to 1400-1600° C. for 2 hours or longer in nitrogen gas at an ordinary pressure, and thereafter, and the molded body was fired at 1700° C. for 8 hours in nitrogen gas, thereby obtaining Sample No. 2 and Sample No. 3.

For Sample No. 1, polishing working for smoothing one main surface (the surface which served as the surface of the flow path) of the sintered body corresponding to the cover portion was performed thereon, and Sample No. 1 was bonded to a sintered body in which the side wall portion and the bottom plate portion were integrated.

Next, metal layers were provided at two locations on the upper surface of the cover portion of each sample, and a semiconductor device was mounted on each of the metal layers. Then, the temperature of a discharged fluid was measured in a state where the semiconductor device was operated, cases in which the temperatures of the fluid were high were evaluated as having excellent heat exchange efficiency, and evaluation was performed by ranking the cases in the descendent order from the higher fluid temperature.

Next, after a sample was cut from the cover portion of each sample into an appropriate size, a configuration part as As shown in Table 1, Sample No. 3 had the most excellent heat exchange efficiency. It was found from the results that the excellent flow path member was obtained when the plurality of needle-shaped crystals which existed on the surface of the flow path, intersected each other.

EXAMPLE 2

Next, heat exchange efficiency was compared on the basis of differences in heights of the extending regions of the needle-shaped crystals. Note that samples were produced by a method similar to that for Sample No. 3 in Example 1 except that the longer diameter of the β-type silicon nitrogen powder was set to 5.0 μm for Sample No. 5 and to 6.0 μm for Sample No. 6 and the sintering conditions were changed to 1800° C. for 10 hours for Sample No. 6. Sample No. 4 was the same sample as Sample No. 3.

Then, the heat exchange efficiency was compared by the method similar to that in Example 1, and ranking thereof was obtained. In addition, a sample having an appropriate size was cut from the cover portion of each sample, a configuration part as illustrated in the schematic view of FIG. 4 was checked by using an SEM at 2000-fold magnification, and the height of the extending region of the needle-shaped crystals was obtained. The results are shown in Table 2.

TABLE 2

| Sample No. | Height of extending region (μm) | Heat exchange efficiency |
|---|---|---|
| 4 | 8 | 3 |
| 5 | 10 | 2 |
| 6 | 20 | 1 |

As illustrated in Table 2, it was found that the heat exchange efficiency was improved when the height of the extending region of the needle-shaped crystal was equal to or greater than 10 μm.

EXAMPLE 3

Next, heat exchange efficiency was compared on the basis of the number of long needle-shaped crystals having an aspect ratio of equal to or greater than 6 within an area of 2600 μm$^2$ on the surface of the flow path. Note that magnesium oxide powder was used as a sintering aid in addition to the yttrium oxide powder for Sample No. 8 and Sample No. 9. In addition, samples were produced by a method similar to that for Sample No. 3 in Example 1 except that the weighed amounts for addition were 0.5% by mass in terms of MgO for Sample No. 8 and 2.0% by mass in terms of MgO for Sample No. 9. Sample No. 7 was the same sample as Sample No. 3.

Then, the heat exchange efficiency was compared by the method similar to that in Example 1, and ranking thereof was obtained. In addition, a sample having an appropriate size was cut from the cover portion of each sample, and the number of long needle-shaped crystals having an aspect ratio of equal to or greater than 6 within an area of 2600 μm$^2$ was checked by using a photograph of the surface of the flow path as viewed from the front, as illustrated in the schematic view of FIG. 5, using a SEM at 2000-fold magnification. The results are shown in Table 3.

TABLE 3

| Sample No. | Long needle-shaped crystals (Number of crystals) | Heat exchange efficiency |
| --- | --- | --- |
| 7 | 8 | 3 |
| 8 | 10 | 2 |
| 9 | 15 | 1 |

As illustrated in Table 3, it was found that the heat exchange efficiency was improved when ten or more long needle-shaped crystals having an aspect ratio of equal to or greater than 6 existed within an area of 2600 μm$^2$ on the surface of the flow path.

EXAMPLE 4

Next, samples having different number of long needle-shaped crystals having an aspect ratio of equal to or greater than 6 between the inlet ports and the centers of the flow paths were produced, and heat exchange efficiency thereof was compared. Note that Sample No. 10 was the same sample as Sample No. 8, Sample No. 11 was obtained by applying a slurry containing Mg to the inlet port on the base of Sample No. 8 when the green sheets were laminated, and Sample No. 12 was obtained by applying a slurry containing Mg to the center on the base of Sample No. 8 when the green sheets were laminated.

Then, the heat exchange efficiency was compared by the method similar to that in Example 1, and ranking thereof was obtained. In addition, a sample having an appropriate size was cut from the cover portion at the inlet port and the center of the flow path of each sample, and thereafter the number of long needle-shaped crystals having an aspect ratio of equal to or greater than 6 within an area of 2600 μm$^2$ of the respective parts was checked by using a photograph of the surface of the flow path as viewed from the front, as illustrated in the schematic view of FIG. 5, using a SEM at 2000-fold magnification. The results are shown in Table 4.

TABLE 4

| Sample No. | Long needle-shaped crystals at inlet port (Number of crystals) | Long needle-shaped crystals at center (Number of crystals) | Heat exchange efficiency |
| --- | --- | --- | --- |
| 10 | 10 | 10 | 3 |
| 11 | 15 | 10 | 2 |
| 12 | 10 | 15 | 1 |

As illustrated in Table 4, it was found that the heat exchange efficiency was improved when the number of long needle-shaped crystals having an aspect ratio of equal to or greater than 6 increases from the inlet port toward the center of the flow path.

EXAMPLE 5

Next, samples having different heights of the extending regions of the needle-shaped crystals between the surfaces of the flow paths at the cover portions and the surfaces of the flow paths at the side wall portions were produced, and heat exchange efficiency thereof was compared. Note that the samples were produced by the method similar to that for Sample No. 3 in Example 1 except that the ceramic green sheets which served as the cover portions and the ceramic green sheets which served as the side wall portions were formed by using the β-type silicon nitride powder having long diameters illustrated in Table 5.

Then, the heat exchange efficiency was compared by the method similar to that in Example 1, and ranking thereof was obtained. In addition, a sample having an appropriate size was cut from the cover portion and the side wall portion of each sample, and thereafter the height of the extending region of the needle-shaped crystals on the surface of the flow path at the cover portion and on the surface of the flow path at the side wall portion by using photographs of the surface of the flow path at the cover portion and the surface of the flow path at the side wall portion as viewed from the front using a SEM at 2000-fold magnification. The results are shown in Table 5.

TABLE 5

| Sample No. | Longer diameter of β-type silicon nitride powder (μm) | | Height of extending region (μm) | | Heat exchange efficiency |
| --- | --- | --- | --- | --- | --- |
| | Cover portion | Side wall portion | Cover portion | Side wall portion | |
| 13 | 4 | 5 | 8 | 10 | 3 |
| 14 | 5 | 5 | 10 | 10 | 2 |
| 15 | 5 | 4 | 10 | 8 | 1 |

As illustrated in Table 5, it was found that the heat exchange efficiency was improved when the height of the extending region of the needle-shaped crystals on the surface of the flow path at the cover portion was higher than the height of the extending region of the needle-shaped crystal on the surface of the flow path at the side wall portion.

EXAMPLE 6

Next, flow path members having heat conductivity illustrated in Table 6 were produced by adjusting the amounts of the sintering aids. Specifically, samples were produced by the method similar to that for Sample No. 3 in Example 1 except that yttrium oxide powder, hafnium oxide powder, magnesium oxide powder, and calcium oxide powder were used as the sintering aids, and the sintering aids were added to satisfy the amount of addition illustrated in Table 6. Sample No. 16 is the same sample as Sample No. 3. In addition, the heat exchange conductivity was compared, and ranking thereof was obtained by the method similar to that in Example 1. The results are shown in Table 6.

TABLE 6

| Sample No. | Sintering aid Constituent | Amount of addition (% by mass) | Heat conductivity (W/(m · K)) | Heat exchange efficiency |
|---|---|---|---|---|
| 16 | Y$_2$O$_3$ | 7.0 | 45 | 3 |
| 17 | Y$_2$O$_3$ | 7.0 | 50 | 2 |
|  | HfO$_2$ | 2.4 |  |  |
| 18 | Y$_2$O$_3$ | 5.0 | 80 | 1 |
|  | HfO$_2$ | 1.5 |  |  |
|  | MgO | 2.0 |  |  |
|  | CaO | 1.0 |  |  |

As illustrated in Table 6, it was found that the heat exchange efficiency was improved when the heat conductivity of silicon nitride ceramics was equal to or greater than 50 W/(m·K). Also, it was also found that the heat conductivity may be equal to or greater than 80 W/(m·K).

EXAMPLE 7

Next, samples having different strength ratios $I_s/I_m$ between the surfaces of the flow paths at the cover portions and the surfaces of the flow paths at the side wall portions were produced, and heat exchange efficiency thereof was compared. Note that the samples were produced by the method similar to that for Sample No. 3 in Example 1 except that the ceramic green sheets which served as the cover portions and the ceramic green sheets which served as the side wall portions were formed by using the yttrium oxide powder and the hafnium oxide powder of the amounts of addition illustrated in Table 7. Note that 2.0% by mass of magnesium oxide powder and 1.0% by mass of calcium oxide powder were added as sintering aids to the respective samples in addition to the yttrium oxide powder and the hafnium oxide powder.

Then, the heat exchange efficiency was compared by the method similar to that in Example 1, and ranking was obtained. In addition, the strength ratios $I_s/I_m$ between the surfaces of the flow paths at the cover portions and the surfaces of the flow paths at the side wall portions of the respective samples were measured by using the XRD using Kα rays of Cu. Note that the measurement conditions of the tube voltage of 45 kV, the tube current of 110 mA, the detector distance of 17 cm, the collimator diameter of 0.1 mmφ, the measurement time of 60 sec/frame, and the scanning range (2θ) of 10° to 50° were set. The results are shown in Table 7.

As illustrated in Table 7, it was found that the heat exchange efficiency was improved when the strength ratio $I_s/I_m$ on the surface of the flow path at the cover portion is smaller than the strength ratio $I_s/I_m$ on the surface of the flow path at the side wall portion.

The invention claimed is:

1. A flow path member comprising silicon nitride ceramics, wherein the flow path member further comprises:
    an inlet port;
    an outlet port;
    a flow path disposed inside the flow path member, and connected to the inlet port and the outlet port; and
    a plurality of needle-shaped crystals disposed on a surface of the flow path, wherein the plurality of needle-shaped crystals intersect each other.

2. The flow path member according to claim 1, wherein the plurality of needle-shaped crystals comprise an extending region, and a height of the extending region is equal to or greater than 10 μm.

3. The flow path member according to claim 1, wherein ten or more needle-shaped crystals of the plurality of needle-shaped crystals have an aspect ratio of equal to or greater than 6 within an area of 2600 μm$^2$ on the surface of the flow path.

4. The flow path member according to claim 1, wherein on the surface of the flow path, a number of needle-shaped crystals have an aspect ratio of equal to or greater than 6 that increases from the inlet port or the outlet port toward a center of the flow path.

5. The flow path member according to claim 1, further comprising:
    a cover portion placed on an object to be treated; and
    a side wall portion connected to the cover portion;
    wherein the plurality of needle-shaped crystals comprise an extending region having a height at the cover portion greater than a height of the extending region at the side wall portion.

6. The flow path member according to claim 1, wherein a heat conductivity of the silicon nitride ceramics is equal to or greater than 50 W/(m·K).

7. The flow path member according to claim 1, further comprising:
    a cover portion placed on an object to be treated; and
    a side wall portion connected to the cover portion;
    wherein a strength ratio $I_s/I_m$ on the surface of the flow path at the cover portion is less than a strength ratio $I_s/I_m$ on the surface of the flow path at the side wall portion, where $I_m$ denotes peak strength which exists at a diffraction angle of 27.1±0.2° measured by an X-ray

TABLE 7

| Sample No. | Sintering aid | | | | Strength ratio $I_s/I_m$ | | Heat exchange efficiency |
|---|---|---|---|---|---|---|---|
|  | Cover portion | | Side wall portion | | | | |
|  | Constituent | Amount of addition (% by mass) | Constituent | Amount of addition (% by mass) | Cover portion | Side wall portion |  |
| 19 | Y$_2$O$_3$ | 10.0 | Y$_2$O$_3$ | 5.0 | 0.22 | 0.13 | 3 |
|  | HfO$_2$ | 2.5 | HfO$_2$ | 1.5 |  |  |  |
| 20 | Y$_2$O$_3$ | 10.0 | Y$_2$O$_3$ | 10.0 | 0.22 | 0.22 | 2 |
|  | HfO$_2$ | 2.5 | HfO$_2$ | 2.5 |  |  |  |
| 21 | Y$_2$O$_3$ | 5.0 | Y$_2$O$_3$ | 10.0 | 0.13 | 0.22 | 1 |
|  | HfO$_2$ | 1.5 | HfO$_2$ | 2.5 |  |  |  | diffraction apparatus using a Kα ray of Cu, and $I_s$ denotes peak strength which exists at a diffraction angle of 29.7±0.2°.

8. A semiconductor module, comprising:
the flow path member according to claim 1;
a metal layer; and
a semiconductor device disposed on the metal layer.

* * * * *